United States Patent
Johnson et al.

(10) Patent No.: US 7,381,611 B2
(45) Date of Patent: Jun. 3, 2008

(54) MULTILAYERED PHASE CHANGE MEMORY

(75) Inventors: Brian G. Johnson, San Jose, CA (US); Stephen J. Hudgens, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 634 days.

(21) Appl. No.: 10/634,130

(22) Filed: Aug. 4, 2003

(65) Prior Publication Data
US 2005/0030800 A1    Feb. 10, 2005

(51) Int. Cl.
*H01L 21/8234* (2006.01)

(52) U.S. Cl. .................... 438/238; 257/2; 257/42; 438/381

(58) Field of Classification Search ........ 257/E31.029, 257/42
See application file for complete search history.

(56) References Cited

U.S. PATENT DOCUMENTS

| | | | |
|---|---|---|---|
| 4,115,872 A | 9/1978 | Bluhm | |
| 4,177,475 A | 12/1979 | Holmberg | |
| 4,366,614 A | 1/1983 | Kumurdjian | |
| 5,789,758 A * | 8/1998 | Reinberg | 257/3 |
| 6,809,362 B2 * | 10/2004 | Gilton | 257/296 |
| 6,908,808 B2 * | 6/2005 | Gilton | 438/238 |
| 2003/0001230 A1 | 1/2003 | Lowrey | |
| 2003/0116794 A1 | 6/2003 | Lowrey | |
| 2003/0223285 A1 * | 12/2003 | Khouri et al. | 365/200 |
| 2004/0051094 A1 * | 3/2004 | Ooishi | 257/5 |
| 2004/0113137 A1 * | 6/2004 | Lowrey | 257/5 |
| 2004/0114413 A1 * | 6/2004 | Parkinson et al. | 365/100 |
| 2004/0178401 A1 * | 9/2004 | Ovshinsky et al. | 257/2 |

FOREIGN PATENT DOCUMENTS

WO    WO 03/023875    3/2003

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 26-20, 2003.

(Continued)

*Primary Examiner*—Thao P. Le
(74) *Attorney, Agent, or Firm*—Trop, Pruner & Hu, P.C.

(57) ABSTRACT

A phase change layer may switch between more and less conductive states in response to electrical stimulation. The phase change layer may be positioned over a non-switching ovonic material which acts as an electrode, a resistive heater, and an insulating barrier. The phase change layer may be positioned over a non-switching ovonic material which acts as an electrode, a resistive heater, and a thermal barrier.

30 Claims, 4 Drawing Sheets

OTHER PUBLICATIONS

Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.

Hwang, Y,N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

Parkinson, W.D., Lowrey, T.A., "Memory Access Devices," U.S. Appl. No. 10/319,769, filed Dec. 13, 2002.

Lowrey, T.A., "Memory and Access Device and Method Therefor," U.S. Appl. No. 10/319,764, filed Dec. 13, 2002.

Van Landingham, "Circuit Applications of Ovonic Switching Devices", IEEE Transactions on Electron Devices, vol. ED-20, No. 2, Feb. 1973.

* cited by examiner

MULTILAYERED PHASE CHANGE MEMORY

BACKGROUND

This invention relates generally to phase change memories.

Phase change memory devices use phase change materials, i.e., materials that may be electrically switched between a generally amorphous and a generally crystalline state, as an electronic memory. One type of memory element utilizes a phase change material that may be, in one application, electrically switched between generally amorphous and generally crystalline local orders or between the different detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the program value represents a phase or physical state of the memory (e.g., crystalline or amorphous).

Thus, there is a need for alternate ways to form phase change memories.

DETAILED DESCRIPTION

Figure 1:
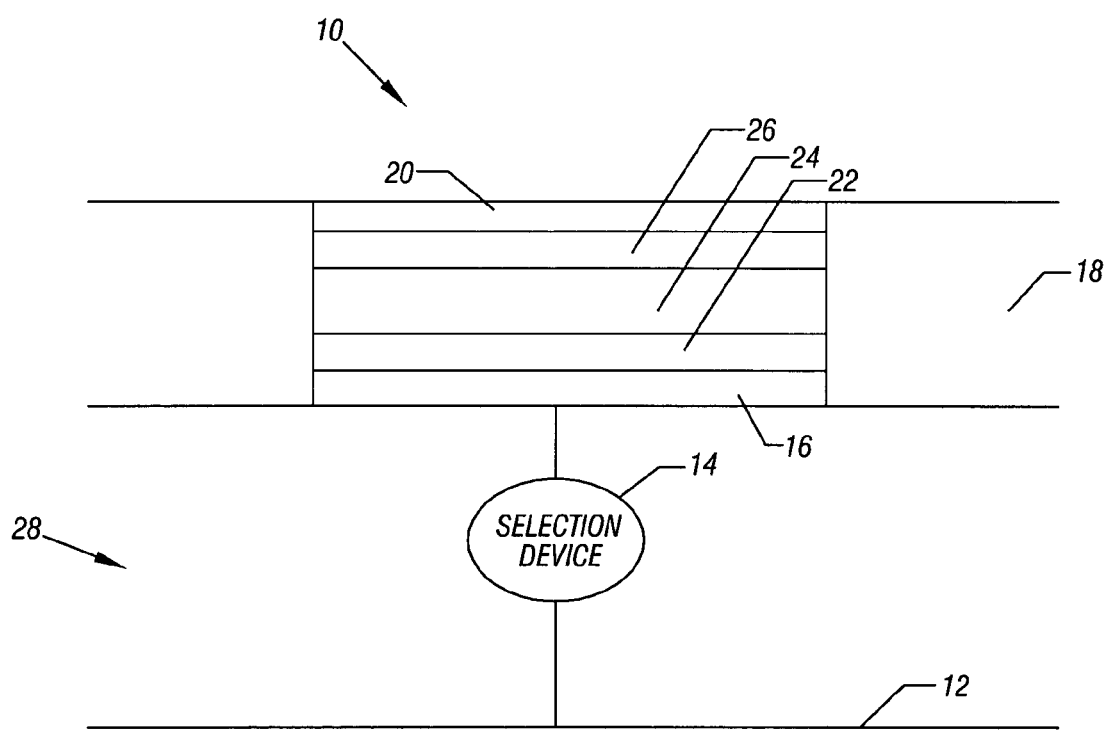
FIG. 1 is a partially cross-sectional and partially schematic depiction of one embodiment of the present invention.

Referring to FIG. 1, a phase change memory may include a cell 10. The cell 10 may be accessed by a pair of conductive lines including the line 12, which is coupled selectively to the cell 10 by a selection device 14. The selection device 14 may also be called an access device or an isolation device. The selection device 14, in one embodiment, may be formed in a semiconductor substrate 28. As examples, the selection device 14 may be a transistor or a diode. The lines 12 may be address lines that may be used to address one cell in an array of cells, addressable using said lines 12, for reading or programming.

A pore or opening may be defined in an insulating layer 18 formed over the substrate 28. The pore may include a lower electrode 16 coupled to the selection device 14 and upper electrode 20 coupled to another conductive line (not shown). In one embodiment, one conductive line 12 extends in a first direction and the other conductive line extends transversely thereto. The conductive lines may also be known as rows and columns.

Between the upper electrode 20 and the lower electrode 16 is an active phase change memory layer 24 which acts as the memory medium for the cell 10. Above the layer 24 is a chalcogenide or ovonic layer 26. A chalcogenide or ovonic layer 22 is positioned below the layer 24.

The layers 22 and 26 may be crystalline chalcogenide alloys designed to resist transformation into the glassy structural state in one embodiment. Thus, the layers 22 and 26 may be termed non-switching layers because in operation they do not change resistance due to change of phase or high field switching. Thus, the non-switching layers 22 and 26 may be called a stable structural phase. Alloys of permanently lower resistivity chalcogenide material may be used as the layers 22, 26. The layers 22, 26 may interface directly to the active phase change memory layer 24, providing resistive heating, as well as high thermal isolation of the active programmable volume within the layer 24. In one embodiment, the layers 22 and 26 may have a resistivity in the range of 10 to 100 Mohm centimeter.

Because of the resistivity supplied by the layers 22 and 26, more uniform current and better thermal isolation may be delivered to the sandwiched active phase change material layer 24 in one embodiment. This may reduce micro filamentation during programming of the phase change memory cell 10.

The active phase change layer 24 may be sandwiched between symmetrical top and bottom electrode systems, each including a non-switching layer 22 or 26 and an electrode 16 or 20. Heat loss prevention during phase change may be enhanced by the high thermal insulating properties of the layers 22 and 26 in some embodiments. The chemical similarity of the layers 22 and 26 to layer 24 provides for strong adhesion, integrity, and encapsulation in some embodiments. In situ deposition of all three layers 22, 24, and 26 may further improve the interfaces of electrode to phase change elements in some embodiments.

A crystalline chalcogenide alloy designed to resist phase transformation may be used for the layers 22 and 26 and to provide electrical contacts to the active phase change material layer 24. Examples of materials that may be utilized for the layer 22 and 26 include materials of the form $As_X Se_Y$ where X is 2 or 9 and Y is 3.

In one embodiment, the phase change material for the layer 24 may be a non-volatile, phase change material. A phase change material may be a material having electrical properties (e.g., resistance) that may be changed through the application of energy such as, for example, heat, light, voltage potential, or electrical current.

Examples of phase change materials may include a chalcogenide material or an ovonic material. An ovonic material may be a material that undergoes electronic or structural changes and acts as a semiconductor once subjected to application of a voltage potential, electrical current, light, heat, etc. A chalcogenide material may be a material that includes at least one element from column VI of the periodic table or may be a material that includes one or more of the chalcogen elements, e.g., any of the elements of tellurium, sulfur, or selenium. Ovonic and chalcogenide materials may be non-volatile memory materials that may be used to store information. Ovonic or chalcogenide materials may be used to form the layers 22 and 26.

In one embodiment, the memory material for the layer 24 may be chalcogenide element composition from the class of tellurium-germanium-antimony ($Te_x Ge_y Sb_z$) material or a GeSbTe alloy, although the scope of the present invention is not limited to just these materials.

In one embodiment, if the memory material for the layer 24 is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state. Accordingly, in this embodiment, the memory material may be adapted to be altered to one of at least two resistance values within a range of resistance values to provide single bit or multi-bit storage of information.

Programming of the memory material in the layer 24 to alter the state or phase of the material may be accomplished by applying voltage potentials to the line 12 and electrode 20, thereby generating a voltage potential across the memory material layer 24. An electrical current may flow through a portion of the memory material layer 24 in response to the applied voltage potentials, and may result in heating of the memory material layer 24.

This heating and subsequent cooling may alter the memory state or phase of the memory material layer 24. Altering the phase or state of the memory material layer 24 may alter an electrical characteristic of the memory material layer 24. For example, resistance of the material layer 24 may be altered by altering the phase of the memory material layer 24. The memory material may also be referred to as a programmable resistive material or simply a programmable material.

In one embodiment, a voltage potential difference of about 3 volts may be applied across a portion of the memory material by applying about 3 volts to a lower line 12 and about zero volts to an upper electrode 20. A current flowing through the memory material layer 24 in response to the applied voltage potentials may result in heating of the memory material. This heating and subsequent cooling may alter the memory state or phase of the material.

In a "reset" state, the memory material in the layer 24 may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

Due to electrical current, the memory material in the layer 24 may be heated to a relatively higher temperature to amorphisize memory material and "reset" memory material (e.g., program memory material to a logic "0" value). Heating the volume or memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

The information stored in memory material layer 24 may be read by measuring the resistance of the memory material. As an example, a read current may be provided to the memory material using opposed line 12 and electrode 20 and a resulting read voltage across the memory material may be compared against a reference voltage using, for example, a sense amplifier (not shown). The read voltage may be proportional to the resistance exhibited by the memory storage element. Thus, a higher voltage may indicate that memory material is in a relatively higher resistance state, e.g., a "reset" state. A lower voltage may indicate that the memory material is in a relatively lower resistance state, e.g., a "set" state.

Figure 2:
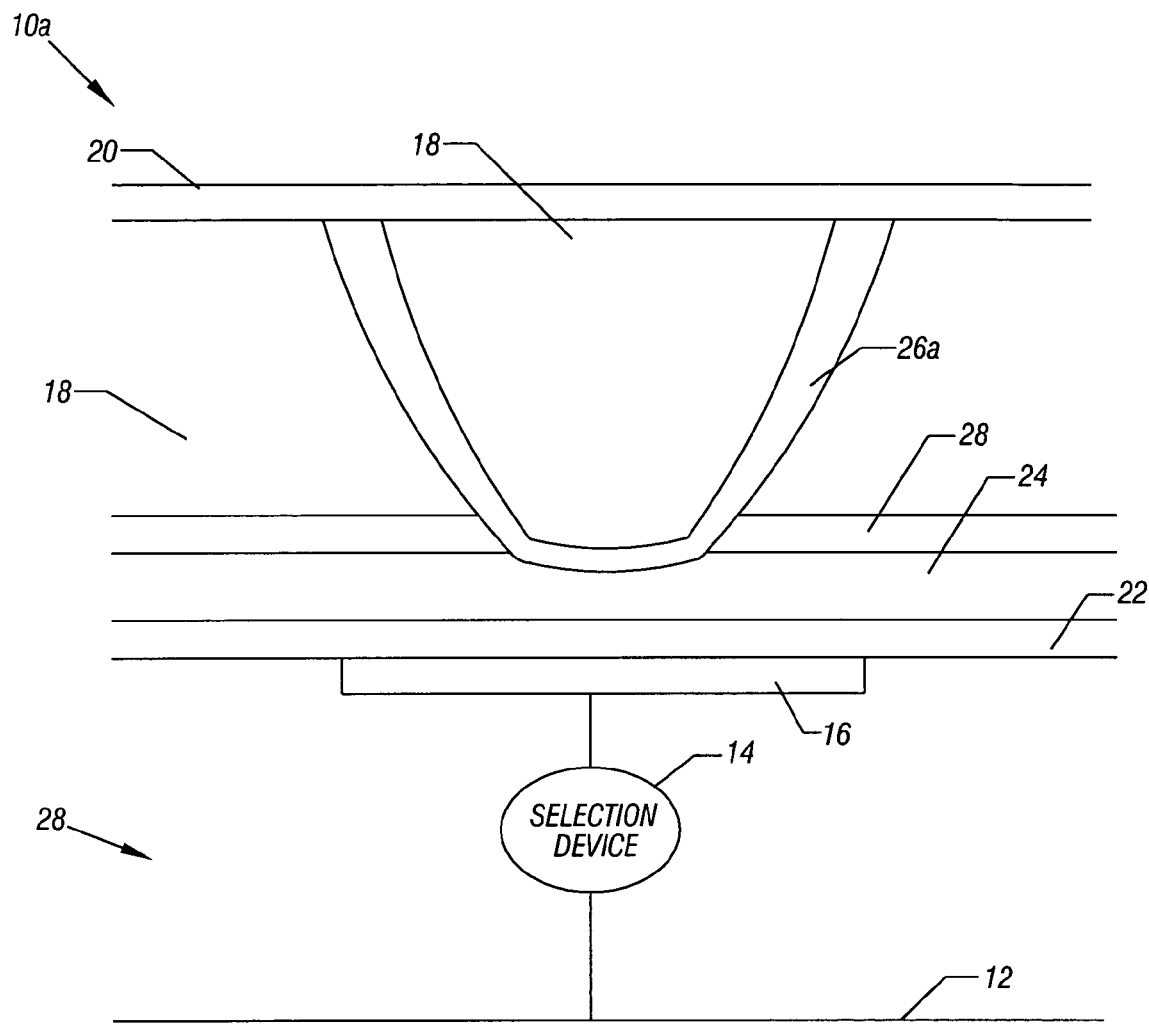
FIG. 2 is a partially cross-sectional and a partially schematic view of another embodiment of the present invention.

Referring to FIG. 2, in accordance with another embodiment of the present invention, a non-switching cup-shaped material 26a may be filled with an insulator 18, such as oxide. The active phase change memory layer 24 may be sandwiched between layers 22 and 26, which may be a non-switching phase change material and the layer 28. The layer 28 may be an electrically insulating nitride encapsulation layer in one embodiment of the present invention. For the non-switching cup-shaped material layer 26a to connect to layer 18, an etch through the layer 18 may be used. The material 26a may be a chalcogenide or ovonic material of the form $As_XSe_Y$, where X is 2 or 9 and Y is 3, for example.

Figure 3:
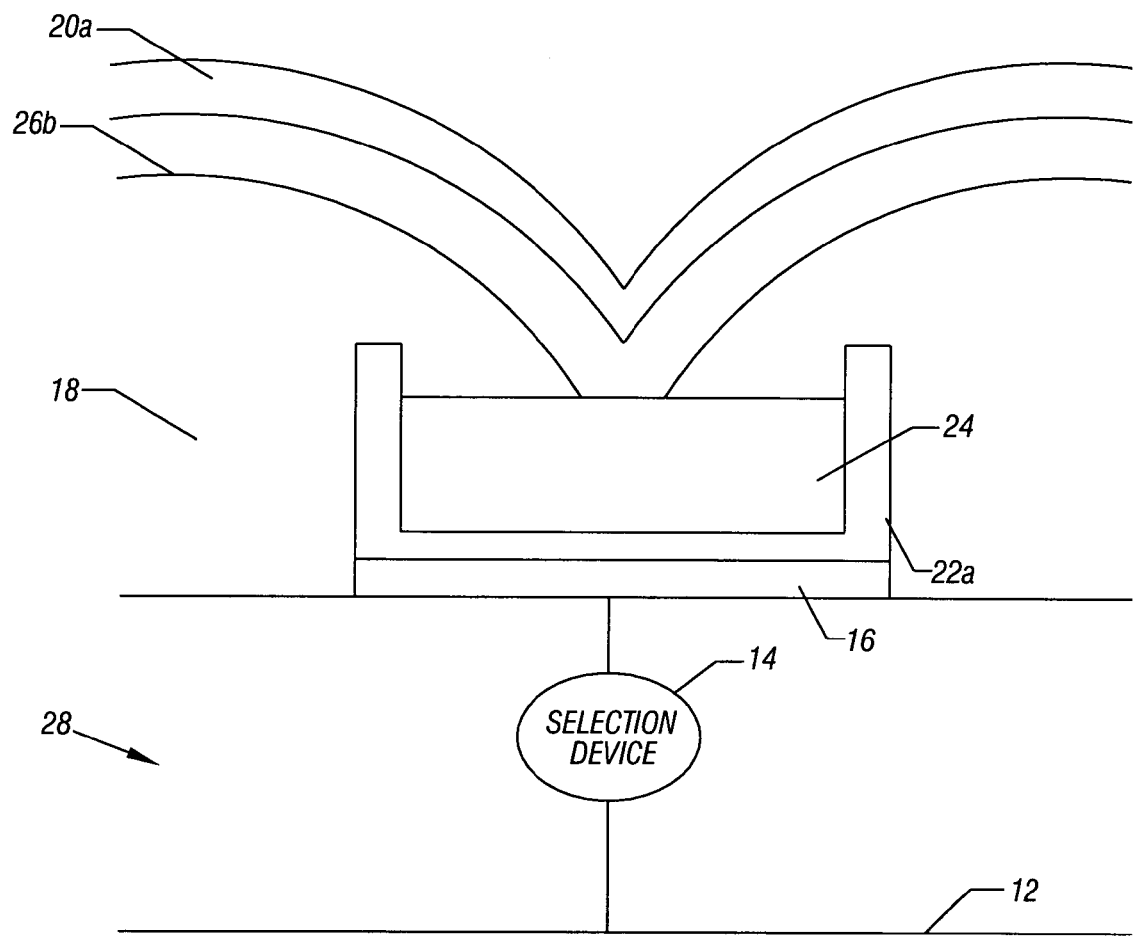
FIG. 3 is a partially cross-sectional and partially schematic view of still another embodiment of the present invention.

In accordance with still another embodiment of the present invention, shown in FIG. 3, a non-switching material layer 22a may be non-planar and in one embodiment, the non-switching layer 22a may be U-shaped. The active or switching phase change memory layer 24 may be contained within the U-shaped layer 22a in one embodiment. The non-switching layer 26b may be formed over an insulating layer 18 which has been shaped into a sub-lithographic opening size by a spacer process, for example. The non-switching layer 26b is made to contact the active switching layer 24 and serve as an electrode. A conductor 20a may be deposited over the layer 26b to provide an upper electrical connection. The layers 22a and 26b may be a chalcogenide or ovonic material of the form $As_XSe_Y$, where X is 2 or 9 and Y is 3, for example.

In some embodiments, the layers 22 and 26 may be permanently of a low resistivity to make a good ohmic contact to the active switching layer 24. In some other embodiments a higher resistivity layer 22 or 26 is selected to achieve resistive heating to assist in heating the active switching material layer 24 to produce phase change. The layers 22 and 26 may not switch between conductive and resistive states. The layers 22 and 26 may provide, in some cases, resistive heating, higher thermal insulation, more uniform current, stronger adhesion to the switching layer 24, and the ability to use the same deposition chamber for all three layers. This may increase cleanliness and improve throughput.

Figure 4:
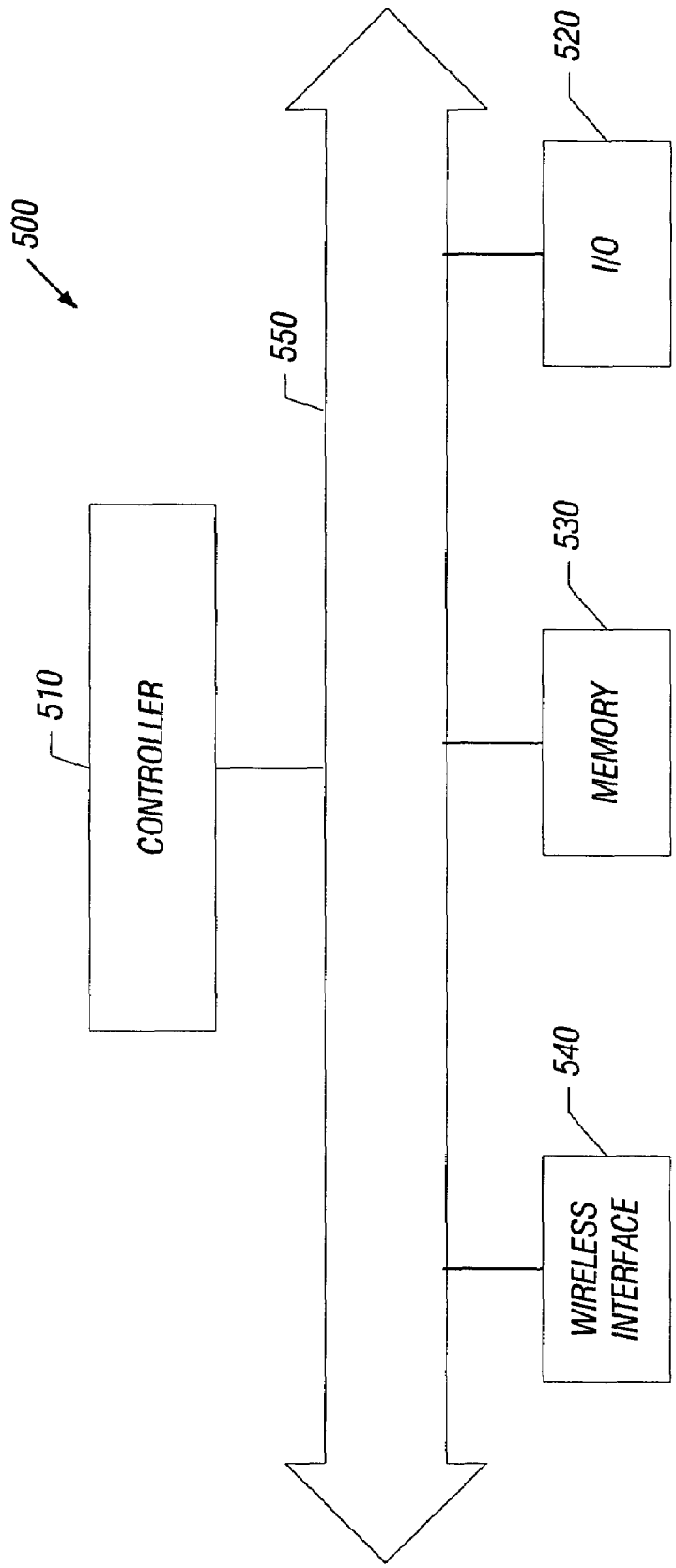
FIG. 4 is a system depiction of one embodiment of the present invention.

Turning to FIG. 4, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise a volatile memory (any type of random access memory), a non-volatile memory such as a flash memory, and/or phase change memory that includes a cell such as, for example, the cell 10 illustrated in FIG. 1 which may employ non-switching chalcogenide electrode layers 22, 26 in one embodiment.

The I/O device 520 may be used to generate a message. The system 500 may use the wireless interface 540 to transmit and receive messages to and from a wireless communication network with a radio frequency (RF) signal. Examples of the wireless interface 540 may include a wireless transceiver or an antenna, such as a dipole antenna, although the scope of the present invention is not limited in this respect.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a substantially crystalline, non-switching ovonic material; and
   forming a phase change material that changes between more conductive and less conductive states coupled to said non-switching ovonic material.

2. The method of claim 1 including forming said non-switching ovonic material over said phase change material and forming a second ovonic material under said phase change material.

3. The method of claim 1 including contacting said non-switching ovonic material with an electrode.

4. The method of claim 3 including forming a second ovonic material over said phase change material, forming said non-switching ovonic material under said phase change material, and contacting said non-switching and second ovonic materials with electrodes.

5. The method of claim 1 including forming said phase change material and said non-switching ovonic material in a pore formed in an insulator.

6. The method of claim 1 including forming a second ovonic material in a cup-shape over said phase change material.

7. The method of claim 6 including filling said cup-shaped ovonic material with an insulator.

8. The method of claim 7 including covering said phase change material with an insulating material.

9. The method of claim 8 including positioning said second ovonic material on a portion of said phase change material and covering the rest of said phase change material with nitride.

10. The method of claim 1 including forming a cup-shaped first ovonic material and forming said phase change material within said cup-shaped first ovonic material.

11. The method of claim 10 including providing a second ovonic material that contacts the upper side of said phase change material.

12. The method of claim 11 including covering a portion of said phase change material with an insulator and causing said second ovonic material to contact only a portion of said first phase change material.

13. The method of claim 10 wherein said non-switching ovonic material is a stable structural phase.

14. A memory comprising:
    a substantially crystalline, non-switching ovonic material; and
    a phase change material that changes between more conductive and less conductive states coupled to said non-switching ovonic material.

15. The memory of claim 14 including a second ovonic material over said phase change material.

16. The memory of claim 14 including an electrode contacting said non-switching ovonic material.

17. The memory of claim 15 including a first electrode contacting said non-switching ovonic material and a second electrode contacting said second ovonic material, said phase change material sandwiched between said non-switching ovonic material, said second ovonic material, and said first and second electrodes, and said phase change material being sandwiched by said first and second electrodes.

18. The memory of claim 14 including a substrate under said first ovonic material.

19. The memory of claim 14 wherein said non-switching ovonic material is cup-shaped.

20. The memory of claim 19 wherein said phase change material is in said cup-shaped non-switching ovonic material.

21. The memory of claim 14 including a second ovonic material over said phase change material, said second ovonic material being cup-shaped.

22. The memory of claim 21 including an insulator in said cup-shaped second ovonic material.

23. The memory of claim 21 wherein said second ovonic material is in contact with said phase change material along a portion of the phase change material and the remaining portion of said phase change material is covered by an insulator.

24. The memory of claim 14 wherein said non-switching ovonic material is a chalcogenide.

25. The memory of claim 14 wherein said phase change material is a chalcogenide.

26. The memory of claim 14 wherein said non-switching ovonic material and said phase change material are formed of a chalcogenide.

27. A system comprising:
    a processor-based device;
    a wireless interface coupled to said processor-based device; and
    a semiconductor memory coupled to said device, said memory including a substantially crystalline, non-switching ovonic material and a phase change material that changes between more conductive and less conductive states over said non-switching ovonic material.

28. The system of claim 27 wherein said wireless interface includes a dipole antenna.

29. The system of claim 27 wherein said non-switching ovonic material and said phase change material are both formed of a chalcogenide.

30. The system of claim 27 including a second ovonic material over said phase change material.

* * * * *